United States Patent [19]

Ngai et al.

[11] Patent Number: 5,119,105
[45] Date of Patent: Jun. 2, 1992

[54] M&A FOR PERFORMING NEAR FIELD MEASUREMENTS ON A DISH ANTENNA AND FOR UTILIZING SAID MEASUREMENTS TO REALIGN DISH PANELS

[75] Inventors: Eugene C. Ngai, Northboro; Carlo J. Mistretta, Maynard; Luther E. Rhoades, Stow; Joseph B. Sangiolo, Weston; Reuven Shavit, Acton, all of Mass.

[73] Assignee: Electronic Space Systems Corporation, Concord, Mass.

[21] Appl. No.: 680,049

[22] Filed: Mar. 29, 1991

Related U.S. Application Data

[63] Continuation of Ser. No. 370,691, Jun. 23, 1989, abandoned.

[51] Int. Cl.⁵ ............................................. G01R 29/10
[52] U.S. Cl. ........................................ 343/703; 343/882
[58] Field of Search ............... 343/703, 878, 880, 881, 343/882; 324/77 B, 77 CS

[56] References Cited

U.S. PATENT DOCUMENTS 4,201,987  5/1980  Tricoles et al. ..................... 343/703

FOREIGN PATENT DOCUMENTS

| 3722406 | 10/1988 | Fed. Rep. of Germany | 343/703 |
| 55-144534 | 11/1980 | Japan | 343/703 |
| 61-160067 | 7/1986 | Japan | 343/703 |
| 1269054 | 11/1986 | U.S.S.R. | 343/703 |

OTHER PUBLICATIONS

K. M. Keen, "Simulation of a Proposed Near-Field-To Far-Field Antenna Measurement System", Electronics Letters, vol. 13, No. 8, Apr. 1977, pp. 225-226.
Lombardi et al., "Wide Band Antenna Test Facility", Electrical Communication, vol. 49, No. 1, 1974, pp. 94-98.
European Space Agency-Spherical Near-Field Antenna Test Facility Spherical Near-Field Antenna Measurements, J. E. Hansen.
Surface Accuracy of the ATS-2 Antenna Using Microwave Holography, Interferomatics, Inc.
Microwave System News, vol. 18, No. 12.
IEEE Transactions on Antennas and Propogation, vol. AP-33, No. 11 Nov. 1985.
Lincoln Laboratory Antenna Test Range, the Microwave Journal, Apr. 1961 The Reflector, A Computational Technique for Reflector Angennas Using Optical Methods and Shperical Wave Expansions.

Primary Examiner—Michael C. Wimer
Assistant Examiner—Hoanganh Le
Attorney, Agent, or Firm—Wolf, Greenfield & Sacks

[57] ABSTRACT

A method and apparatus are provided performing near-field measurements on dish antenna, in particular large dish antenna, and for utilizing these measurements to realign dish panels. The antenna is tiltable about a pivot point on a mounting pedestal to any desired elevation angle. A substantially circular track is provided which is centered at and spaced a predetermined distance from the pivot point, the track preferably being adjustably mounted to a stiff circular arch. The antenna is rotatable in the azimuth direction, preferably by rotating the pedestal, and a scanning probe is provided which is mounted for control traversal on the circular track. The probe is utilized to perform near-field measurements on the antenna at selected azimuthal positions of the antenna and selected positions of the probe on the track. The probe may also be rotatable to at least two different polarizations. The movement are performed in small stepwise increments in a predetermined sequence and measurements are taken by utilizing an RF signal transmitted by the antenna or probe and received by the other. For panel realignment, the near-field measurements are transformed mathematically to far-field values which are in turn transformed mathematically to holographic pictures which provide an indication of panel misalignment. This indication is then used to realign appropriate panels and the process repeated until panel alignments are within acceptable limits.

17 Claims, 5 Drawing Sheets

M&A FOR PERFORMING NEAR FIELD MEASUREMENTS ON A DISH ANTENNA AND FOR UTILIZING SAID MEASUREMENTS TO REALIGN DISH PANELS

This is a continuation of copending application Ser. No. 07/370,691 filed on Jun. 23, 1989 now abandoned.

FIELD OF THE INVENTION

This invention relates to methods and apparatus for testing and realigning dish antenna and more particularly to a method and apparatus for performing near field measurements on large dish antenna biased to a desired elevation angle and for utilizing such near field measurements to realign antenna dish panels to compensate for gravity effects at the selected elevation.

BACKGROUND OF THE INVENTION

For large dish antenna, such as those used for radio astronomy and satellite communication, high precision is required in order to pick up weak signals and to separate desired signals from noise In order to obtain such precision, it is necessary that the antenna in general, and the antenna dish in particular, be carefully tested before being initially installed, and periodic testing may be required thereafter. Such testing has generally been performed on a test range. However, the Rayleigh distance required for such range is given by the equation $R = 2D^2/\lambda$, where $\lambda$ is the wave length of the test signals and D is the diameter of the antenna under test. Thus, for large antenna, with diameters in the range of 25ft or more, the Rayleigh distance becomes prohibitively large for available test ranges. At these distances, echoes from ground reflections and the like as well as other noise are also problems.

To overcome these problems, attempts have been made to test antenna by receiving transmissions from satellites or from stars. However, to fully map the characteristics of an antenna dish may take days, making it difficult to perform such measurements with stars or satellites. Further, when operating in open space, wide variations in environmental conditions such as temperature, humidity, wind, clouds, and the like make it difficult to correlate readings taken over an extended period of time and to obtain high precision test results from such data.

To overcome the problems indicated above, a technique has been developed to take near-field measurements in a controlled environment, and to then mathematically transform the near-field measurements to obtain far-field values. Utilizing near-field measurements is advantageous since it permits measurements to be taken in an enclosed chamber where environmental conditions may be carefully controlled. For example, temperature can be controlled within ±5°, humidity can be controlled within similar limits, wind can be eliminated and stray electric and magnetic fields can be shielded. In addition, the chamber can be covered with RF signal absorbing material to substantially reduce noise resulting from RF reflections. The reflectivity of the chamber is typically about −45 dB, and this number can be improved where required. Near-field measurements also permit the use of a transmitting source which may be selected to transmit at the optimum frequency for the antenna under test and permit tests to be conducted at times desired by the user and over-extended periods of time. This permits far more accurate measurements then can be obtained with existing far-field measuring systems.

However, in order to fully map an antenna dish, three types of movement are required between the probe and the antenna. The first of these movements is movement in the azimuthal or phi($\phi$) axis or direction. The second is movement in elevation or theta($\theta$) axis or direction. The third axes is the polarity or chi($\chi$) axis. Taking measurements in all three of these directions requires certain movements of the antenna and probe. A number of apparatus exist or have been proposed to achieve the desired movements, most of which involve moving the probe in at least one direction by use of some type of robotic arm. While this is feasible for measurements of relatively small antenna, for a large antenna the extent of such arms become too long for practical use. Particularly with long arms, it is also difficult to obtain the precise positioning required in order to accurately map the antenna dish.

Further, particularly for large antenna, the alignment of the panels forming the antenna dish change slightly as a result of gravity as the antenna is moved to different elevations. Typically, the panel alignment is prebiased for a particular rigging or elevation angle, but this mathematically determined prebias is not accurate for all antennas. It is, therefore, desirable to perform near-field measurements on an antenna at the elevation angle at which it is anticipated that the antenna will be utilized, and to be able to map the antenna dish at this angle to determine gravity induced deviations. Adjustments to the panels may then be made to correct for such deviations and the antenna retested at the desired elevation angle to determine if the deviation errors have been reduced within predetermined limits. Several iterations of test and adjustment may be required for high precision antennas, such as those used in radio astronomy, before precision specifications are met. Heretofore, equipment capable of performing near-field measurements on a large antenna at any desired elevation angle has not existed. It has, therefore, not been possible to accurately adjust for gravity-induced antenna deviations in such antenna by performing near-field measurements.

A need, therefore, exist for improved apparatus for performing near-field measurements on antenna and, in particular, for performing such measurements on antenna having large diameter dishes. A need also exist for improved methods of adjusting for gravity-induced deviations in antenna dish panels and, in particular, for such a method which determines deviations from near-field measurements.

SUMMARY OF THE INVENTION

In accordance with the above, this invention provides an improved method and apparatus for performing near-field measurements on antennas, in particularly large antennas, which antennas may be tilted to a desired elevation angle. The apparatus includes a pedestal for mounting the antenna, the antenna being tiltable on the pedestal about a pivot point to the desired elevation angle. A substantially circular track is provided which is centered at and is spaced a predetermined distance from the pivot point. The portion of the track utilized for the mapping of a given antenna at a given elevation angle extends for an arc of at least 90°, and preferably for an arc between 90° and 180°. The antenna is rotatable in the azimuth direction, preferably by rotating the pedestal, and a scanning probe is provided which is mounted for controlled traversal on the circular track. The probe, which may be either a transmitting or a receiving probe at a given RF frequency, is utilized to perform near-field measurements on the antenna at selected azimuthal positions of the antenna and selected positions of the probe on the track. The probe may also be rotatable to at least two different polarizations, such rotations being performed either mechanically or electrically. The rotation of the antenna azimuthally, the movement of the probe along the track, and the rotation of the probe are all performed in stepwise fashion and in a predetermined sequence to effect measurement of the entire antenna dish. The angular separation at which measurements are taken satisfy the Nyquest sampling theorem. Measurements are taken by utilizing a RF signal transmitted by the antenna or probe and received by the other.

The panels on the antenna dish may be realigned by utilizing the near-field measurements indicated above and performing a near-field to far-field transformation on such measurements. A far field to holographic picture transformation is then performed on the computed far-field values to obtain an indication of panel misalignment. This indication is then used to realign appropriate panels and the process of measurement, transformation and adjustment is repeated until the panel alignments are within acceptable limits.

The track on which the probe travels is preferably mounted to a free-standing support arch which is supported at least by legs at each end thereof. The arch is designed to be sufficiently stiff to damp any vibrations caused by probe movement and the track is preferably adjustably mounted to the arch in a manner such that the track may be adjusted to be substantially circular regardless of circular irregularities in the arch.

The foregoing and other objects, features and advantages of the invention will be apparent from the following more particular description of a preferred embodiment of the invention as in the accompanying drawings.

DETAILED DESCRIPTION

Figure 1:
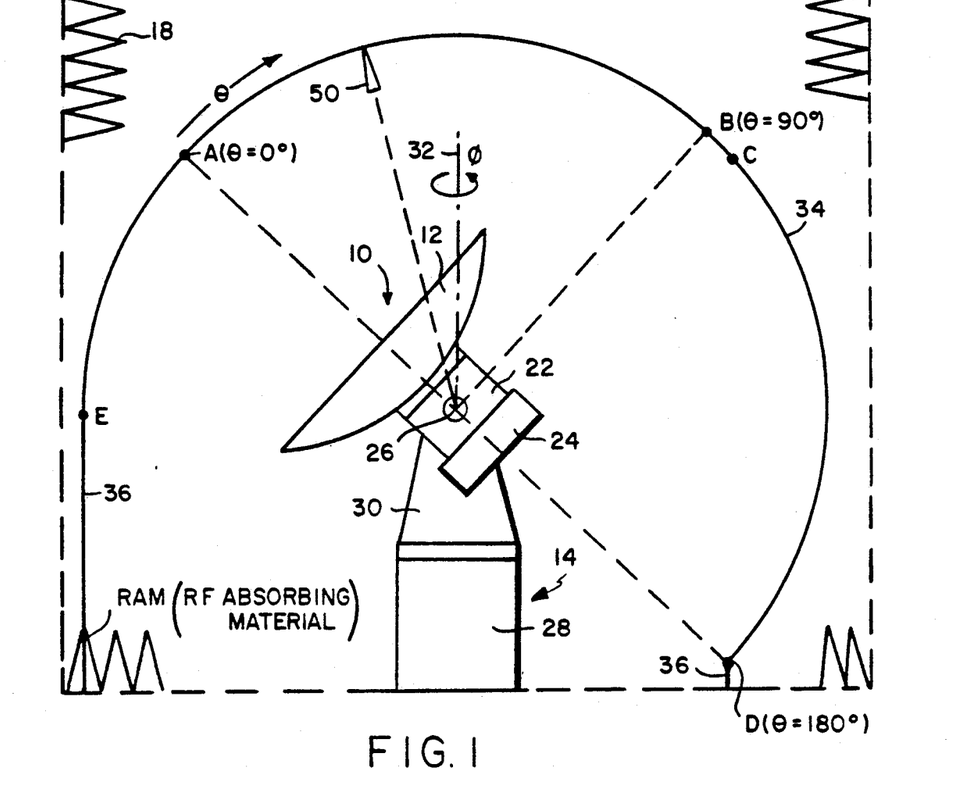
FIG. 1 is a semi schematic diagram of a near field antenna measurement apparatus in accordance with the teachings of this invention.
Figure 7:
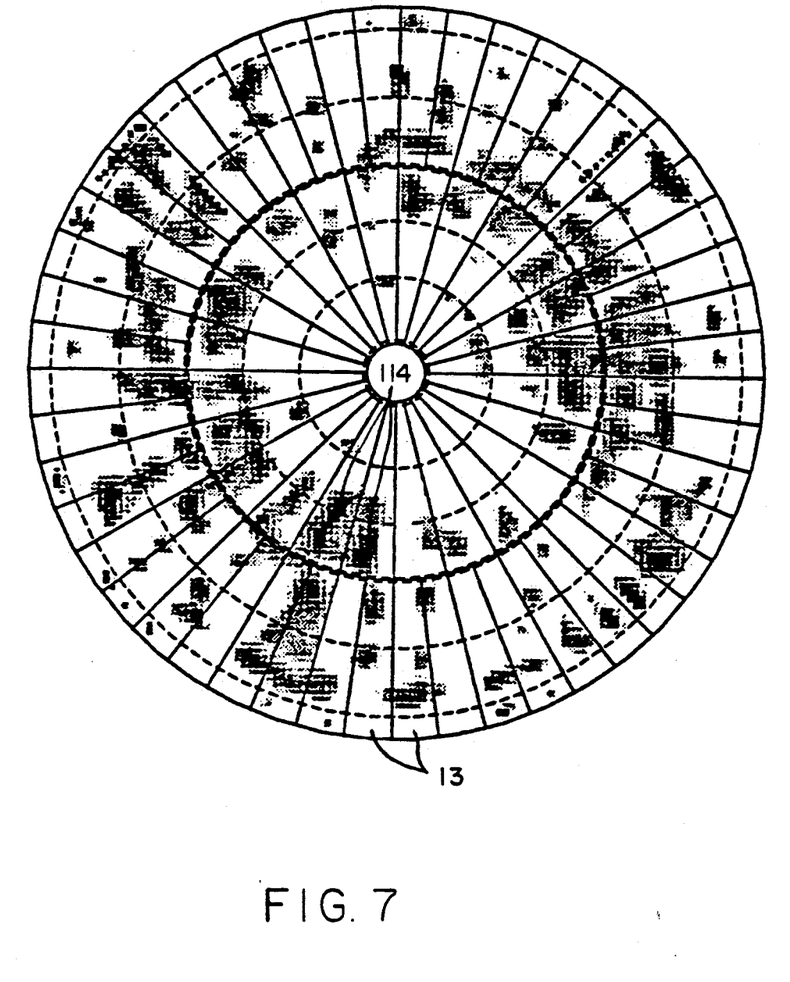
FIG. 7 is a diagram illustrating a deviation pattern of the type obtained utilizing the teachings of this invention.

Referring first to FIG. 1, the antenna under test 10 has a parabolic dish 12 formed of a plurality of overlapping, individual, generally pie-shaped panels 13 (FIG. 7). The antenna is mounted to a test pedestal 14 positioned in a near-field test chamber 16. The test chamber and all components within the test chamber are covered with RF absorbent material 18. shown for illustrative purposes in FIG. 1 in only a few locations, to substantially reduce RF reflections. With proper use of RF absorbent material, the reflectivity of the chamber 16 is typically reduced to −45 dB, and can be further reduced if the requirements for particular measurements so require. The shape of the chamber 16 may for example be rectangular as shown, or may have a full or partial dome configuration. The exact shape of the chamber 16 depends on factors which are outside the scope of this invention.

In addition to dish 12, antenna 10 has a transmitting or receiving feed horn 20 (FIG. 3), a housing 22 containing various electronic controls and a counterweight 24. The antenna 10 is tilted to a desired elevation about a pivot 26 and is secured to pedestal 14 at this pivot point. Since antenna 10 may be quite large, having a dish 12 with a diameter in excess of 25 feet for some applications, and heavy, weighing in excess of two tons, suitable hoisting equipment will be required in chamber 16 in order to raise antenna 10 to be mounted on pedestal 14. The exact manner in which antenna 10 is secured to pedestal 14 to rotate about pivot 26 in the elevation direction is standard and does not form part of the present invention. Such attachment may, for example, be accomplished by bolting the antenna to the pedestal via a suitable transition structure that accommodates the mounting features of the antenna and pedestal.

Pedestal 14 has a fixed base portion 28 and an upper portion 30, which may be rotated through a full 360° about base 28 to provide rotation about the $\phi$ axis 32 for the antenna. Rotation about the $\phi$ axis provides the azimuthal movement required for a full scan of antenna dish 12. The rotation of pedestal portion 30 is accomplished in a stepwise fashion with each step being a very small fraction of a degree, for example 100th to 1000th of a degree. The drive motor and positioning control circuitry for rotating pedestal portion 30 may be contained in pedestal base portion 28, in pedestal portion 30, or partially in each. The position control circuitry will be described in greater detail later.

A circular arch 34 is provided which is supported at each of its ends by a leg 36. Additional legs or other suitable mounting means may be provided for the arch. In FIG. 1, arch 34 is shown as extending through an angle $\theta$ of approximately 220° from a point E, which is roughly horizontally aligned with the pivot point 26, to a point D which is slightly above the bottom of chamber 16. Arch 34 can extend over a greater distance than that shown; but since, as will be discussed shortly, the arch 34 should be as stiff as possible, the arch should not be longer than is absolutely required. Thus, since (a) 180° is the maximum $\theta$ angle which is required in order to achieve maximum resolution in mapping dish 12 of antenna 10; (b) the elevation angles of greatest concern are between 0° and approximately 40°; and (c) the $\theta$ angle for taking measurements on the antenna at a given elevation angle begins at a point A which is a number of degrees along arch 34 from point E which is equal to the number of degrees in the elevation angle, the arch 34 shown in FIG. 1 is 220° so as to be able to provide the full 180° angle for antenna elevations between 0° and 40°. For illustrative purposes, the elevation angle of antenna 10 in FIG. 1 is approximately 40° and a portion of beam 34 (and of the track mounted thereto) which is used for taking readings with the antenna at this angle is a portion from the point A approximately 40° along arch 34 from point E to the point D spaced 180° there-from. However, if less resolution is required at this elevation angle, the portion of arch 34 which is used may extend only through the 90° between points A and B in FIG. 1. Improved resolution may be obtained by extending the arch slightly further, as for example, to point C. Similarly, if the elevation angle is greater than approximate 40°, the scan would still begin at a point A which is a number of degrees from point E roughly equal to the elevation angle but, since arch 34 extends for less than 180° from such point, the scan would also be less than 180°. However, even with the antenna at the possible with the arch shown in FIG. 1, an angle which is substantially greater than the 90° angle below which a full scan of antenna dish 12 cannot be obtained.

Arch 34 should be formed of a material which is stiff, has a low coefficient of thermal expansion and which is not subject to changes in shape over time as a result of material fatigue. In particular, the material selected and the structural configuration of arch 34 should be such that the stiffness of arch 34 is sufficient to result in its resonant frequency being substantially higher than the frequency to which it would be excited by probe movement (i.e., for example, starting and stopping of the probe). As a result, any vibration of the arch caused by such movement is quickly damped and does not affect readings.

A material suitable for use for arch 34 would be for example a steel or steel alloy with a low coefficient of thermal expansion, a low tendency to deform as a result of metal fatigue over time and a very high stiffness. The cross section or arch 34 would typically be square or rectangular as shown in FIG 5 although, for a given application, other shapes might be found to be more suitable.

Figure 5:
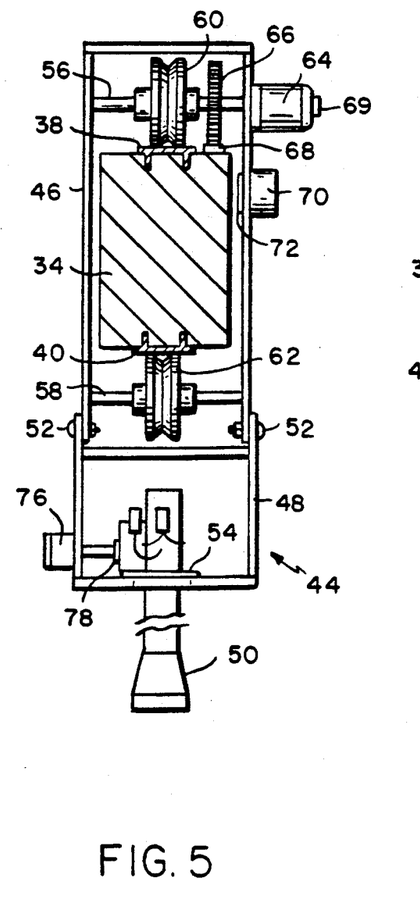
FIG. 5 is a front view of a horn probe and probe trolley mechanism suitable for use with the embodiment of the invention shown in FIG. 1.
Figure 6:
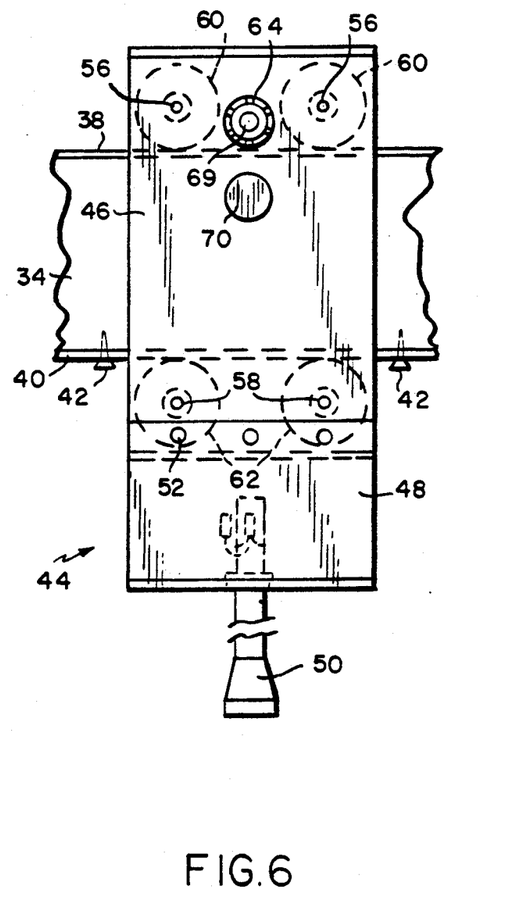
FIG. 6 is a side view of the apparatus shown in FIG. 5.

As may be best seen in FIGS. 5 and 6, an upper track 38 and a lower track 40 are provided on arch 34. The tracks 38 and 40 extend along the entire length of arch 34 and are aligned with each other. Lower track 40 is preferably adjustably mounted to arch 34 by for example providing adjusting screws 42, or by other suitable means. This permits track 40 to be maintained substantially circular over time regardless of slight variations or irregularities which may occur either initially or over time in arch 34.

A probe trolley assembly 44 is provided which rides on tracks 38 and 40. The assembly as shown consists of an upper carriage portion 46 and a lower probe support bracket 48. Carriage 46 and bracket 48 are held together by suitable means such as screws 52. The probe or feed horn 50 being utilized to take a given set of measurements may be changed by unscrewing screws 52 and replacing the probe support bracket 48 and the probe 50 mounted therein with a new bracket 48 containing a different probe 50. In the alternative, the probe 50 may be removably mounted in probe bracket 48, for example by a collar 54, permitting probe 50 to be replaced by a probe designed for example to receive or possibly transmit signals at a different frequency. Collar 54 may also be utilized to permit probe 50 to be moved toward or away from antenna 10, thereby adjusting the probe position.

Carriage 46 has a pair of upper axles 56 and a pair of lower axles 58 mounted therein. A guide wheel 60 is mounted to rotate on each of the axles 56 and a guide wheel 62 is mounted for rotation on each of the axles 58. A motor 64 is mounted to the carriage which motor drives a pinion gear 66. Gear 66 coacts with a toothed rack 68 on arch 34 to move assembly 44 on the arch.

Motor 64, either directly or through internal gearing, is adapted to provide very small, precise movements of gear 66 along rack 68 so that probe 50 may be moved in very small increments and accurately positioned. An encoder mechanism 69 accurately indicates the $\theta$ position of the probe at any given time. A braking assembly is mounted to carriage 46 and, when operated, causes a plunger 72 to bear against arch 34 to prevent spurious movement of assembly 44 along the arch. Either upper track 38, guide wheels 60 or axle 56 may be mounted with a slight resiliency so that the position of assembly 44 may be controlled by adjustable lower track 40 and guide wheels 62 riding thereon, with track 38 and guide wheels 60 performing primarily a guiding and retaining function.

Inputs, outputs, power, and/or controls to probe 50 may be obtained by connecting the probe or probe controls through suitable wiring to a commutator mechanism, preferably mounted on the top surface of arch 34, for example adjacent wheels 60 on the side thereof opposite rack 68. In the alternative, some or all of the signals between probe 50, including its controls and the sources or sinks for various signals to and from such elements, may be applied through a flexible cable (not shown) attached to trolley assembly 44. In order to avoid slack in the cable which may interfere with readings and which may cause RF interference, the cable may for example be mounted to a spring loaded drum positioned near the base of the leg 36 attached to point E on arch 34 with the cable running along the top of the arch or being retracted along the top of the arch as trolley assembly 44 and probe 50 mounted thereto are moved. Another option might be to mount the cable with or without a spring loaded drum to the ceiling of chamber 16 to also move with the trolley 44. In view of the high precision required for the received RF signals, and the fact that either passing these signals through a commutator or a long RF cable may cause some degradation in the accuracy of these signals, it is considered preferable to mount the transmitter or signal generator in trolley 44 with probe 50 serving as the source of RF signals and antenna 10 receiving such signals.

In order to obtain rotation about the $\chi$ or polarity axis, it is necessary that probe 50 be either electronically or mechanically rotatable between two positions which are 90° displaced from each other. If the probe is mechanically rotated, this rotation may be accomplished manually or may be accomplished by use of a small motor 76 operating through a pinion gear 78 and a circular ring of teeth (not shown) on probe support ring 54 to rotate probe 50 to the desired positions. Other suitable means for mechanically rotating the probe may also be employed.

Figure 3:
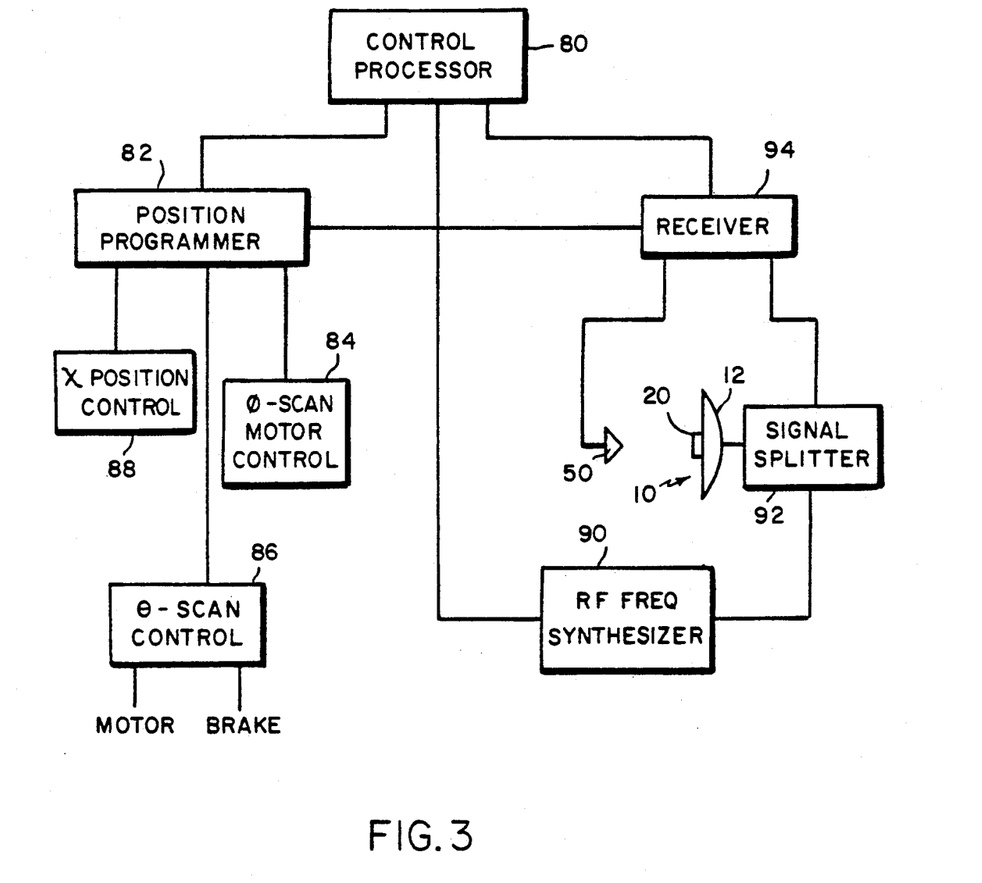
FIG. 3 is a semi-schematic block diagram of controls for a system of the type shown in FIG. 1.

There are two types of electrical control required in connection with the system of this invention. The first type of electrical control controls the position and movement of antenna 10 and probe 50 so that each reading is taken at a precisely controlled and known location. The second type of electrical control controls the RF signal generation from probe 50 or antenna 10, the reception of signals by the nongenerating component and the processing of this information to obtain desired antenna field patterns. FIG. 3 is a schematic diagram illustrating the major components in these two electrical control systems.

Positioning, signal generation/reception, and processing are all performed either by or under the control of a control processor 80. Any of a variety of commercial processor may be used as a control processor 80, including Hewlett Packard 9000 series computer in conjunction with an HP-8410B or an HP-8510B network analyzer. Control signals from processor 80 are applied to a position programmer 82 which in turn controls the sequencing and operation of the motors, braking mechanism, servo systems, electronic controls or other standard controls utilized for controlling each of the three different types of motion involved in performing scans. Thus, position programmer 82 generates outputs which control a $\phi$ scan motor control 84 which in turn controls the rotational position of pedestal portion 30 relative to pedestal portion 28 and thus the azimuthal position of antenna 10. Controller 80 also applies outputs to $\theta$ scan control circuit 86 which in turn generates outputs to control motor 64 and brake 70 to control the position of probe 50 on arch 34. Finally, position programmer 82 generates an output to control $\chi$ position controller 88 which in turn controls motor 76 to adjust the $\chi$ position or polarity of probe 50 or to electronically control this polarity. While the sequence in which these various controls are operated is relevant to this invention, the exact manner in which the controls are performed may be standard and do not form part of the present invention.

Similarly, control processor 80 may control the calibration of probe 50 and other preliminary functions. It is also operative to drive an RF frequency synthesizer 90 which generates an RF signal which is passed through a signal splitter 92 to energize the signal transmitter or feed horn 20 of antenna 10 and is also applied as a reference input to receiver 94 (the antenna being the signal source for the FIG. 3 embodiment). The RF signal picked up by probe 50 is also applied to receiver 94 which generates outputs to processor 80 which are indicative of the amplitude and polarity of the received signal. In particular, two polar inputs, I and Q polarity signals (i.e., in-phase and out-of-phase) are generated and are utilized in conjunction with the amplitude output from receiver 94 by processor 80 to determine amplitude and phase for each reading. These amplitude and phase determinations at each reading are utilized in a manner to be described hereinafter to determine, among other things, required panel adjustments to compensate for gravity induced errors.

Figure 4:
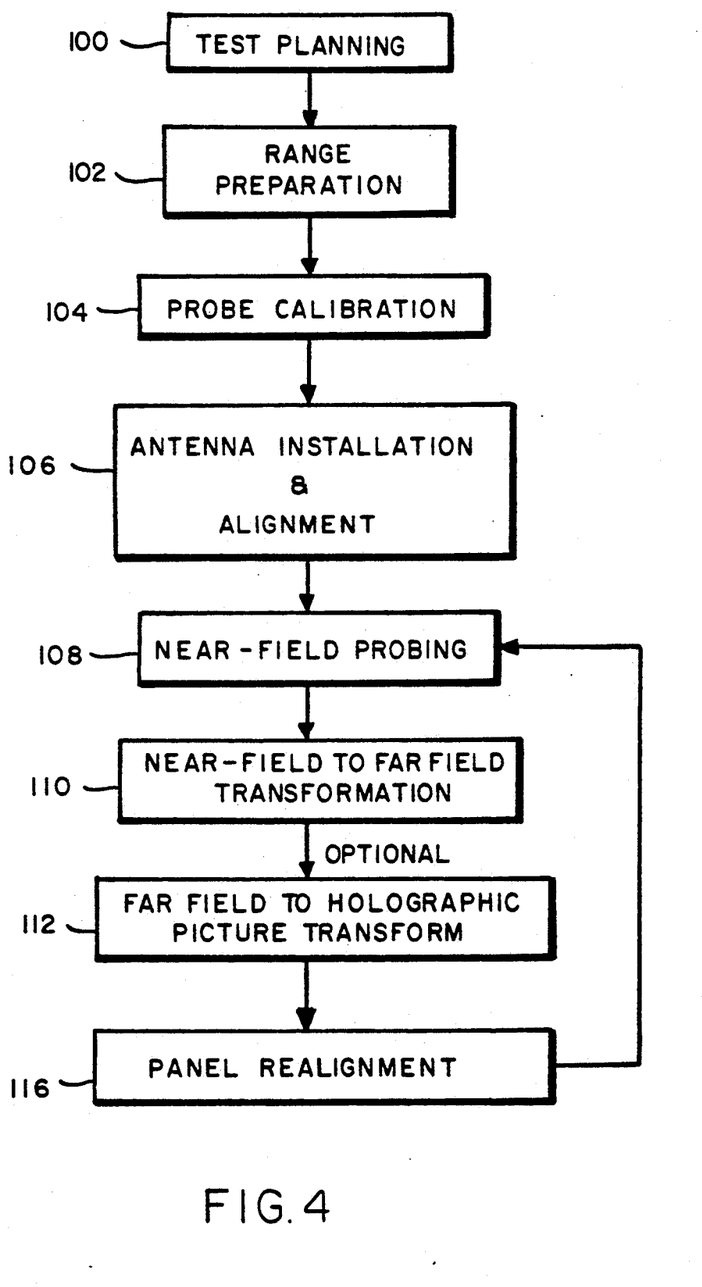
FIG. 4 is a flow diagram illustrating the sequence of operations in performing near-field measurements and antenna dish panel realignment in accordance with this invention.

FIG. 4 is a flow diagram for the operation of the system. The first three steps, steps 100, 102 and 104, are preparatory steps which are normally performed in connection with any field measurement, whether near field or far field. The first of these steps, step 100, is a planning of the test. This involves determining for example the degree of resolution required for the test and thus the extent of movement of probe 50 in the $\theta$ direction. Thus, if only relatively low resolution is required, it may be decided that the probe 50 be moved on arch 34 only through the 90° angle between points A and B. If higher resolution is required, the probe 50 may be advanced through a greater distance, for example, to point C. Where a very high resolution is required, probe 50 may be moved through a full 130° to point D. The degree of resolution required also determines the angular spacing between points in both the $\phi$ and $\theta$ directions at which readings are taken. Step 100 may also involve things such as determining the desired elevation angle for antenna 10 for the test to be conducted, and thus the portion of arch 34 over which probe 50 will be moved for the test, the RF frequency at which the system is to operate, etc.

The second step in the operation, step 102, involves range preparation. This involves the alignment of pedestal 14 and probe 50. It may also involve testing track 40 to assure that it is absolutely circular, or at least circular within prescribe specifications, and adjusting the track at various points relative to arch 34 by, for example, use of screws 42 in order to compensate for an detected nonlinearities. This operation may be performed by, for example, substituting a laser interferometer for probe 50 in assembly 44 and using the interferometer to take accurate distance measurements at selected increments along track 40 of the distance between the interferometer and pivot point 22. Any nonuniformities in this distance are noted and appropriate adjustments made in track 40 to compensate for such irregularities. The interferometer may then be again moved along track 40 and a second set of readings taken. To the extent any reading of the second set is outside of the desired specification, further adjustments can be made in the positioning of track 40. The process of taking interferometer readings and making adjustments can be repeated until track 40 is circular within prescribed specifications. In the alternative, where the detected deviations are systematic and small, such small systematic deviations may be adjusted or compensated for electronically in processor 80 or elsewhere in the system rather than performing a further iteration of adjustment and testing.

During the third step in the operation, step 104, the probe 50 which is to be used for the measurements is mounted and calibrated. There are number of standard techniques available for calibrating probes and the specific technique utilized for performing this calibration operation does not form part of the present invention.

The next step in the operation, step 106, involves installing the antenna 10 and aligning the antenna in the range. As previously indicated, this step involves usinq a hoist or other suitable means to raise antenna 10 to a mounted position on pedestal 14 and to secure the antenna in place in a standard manner. Once in this position, the antenna is aligned in standard fashion and is tilted to the desired elevation angle.

Figure 2:
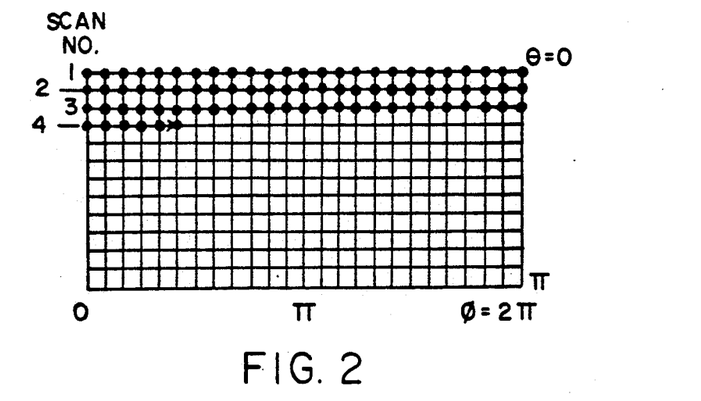
FIG. 2 is a chart illustrating the sequence in which readings may be taken to map an entire antenna dish.

Once these preliminary steps have been completed, the system is ready to perform near-field measurements (step 108). During this step, readings for amplitude and phase or polarity are taken for each possible combination of $\theta$ angle, $\phi$ angle and $\chi$ angle. The order in which the readings are taken is not critical; however, because of the way in which the system is designed, it has been found easier, particularly when the polarity of the probe is controlled electrically rather than manually or mechanically, to initially position the probe at the first desired $\theta$ angle, position the pedestal at the first desired $\phi$ angle, and take readings for the both $\chi$ polarities. Pedestal portion 30 may then be rotated a fraction of a degree to the next desired $\phi$ position and the process repeated with two readings, one for each polarity, being taken. This process is repeated at successive $\phi$ angles of the pedestal until the pedestal has completed a complete 360° rotation. The probe is then advanced a fraction of a degree to the next $\theta$ position at which readings are to be taken and the process is repeated at this location. FIG. 2 illustrates this process with readings being taken at each $\phi$ location through a full 360° rotation of the pedestal for each $\theta$ position at which readings are to be taken. This drawing does not indicate the two separate polarity readings which are taken at each of these locations, but this is in fact what happens.

Since each incremental movement of both pedestal portion 30 and probe 50 are in small fractions of a degree, for example 100th to 1000th of a degree, this means that at maximum precision, up to approximately 130 million readings may be taken in order to map a single antenna dish. Even at relatively low resolution, at least approximately 6.5 million readings may be required. It is therefore apparent that this process can take up to several days for a single antenna and that it is therefore important that it be possible to perform the test under controlled environmental conditions so that there is accurate correlation between readings taken at different times. The amplitude and phase measured and/or determined for each reading are stored in control processor 80. Computations and transfer or storage of data may be performed while measurements are being taken to accelerate the process.

Once the near-field probing step has been completed, the next step in the operation, step 110, is to perform a near field to far field transformation. The mathematics for performing this transformation are well known in the art and are described, for example, in *Spherical Near-Field Antenna Measurements*, edited by J. E. Hansen, published by Peter Peregrinus Limited, London, United Kingdom, 1988. The results of this transformation are the desired far-field amplitude and phase values for the antenna.

In some applications, all that is required is the far-field measurements or values. However, there are some applications where a holographic picture transform of the antenna dish is required. One such application is where it is desired to realing antenna panels 13 to compensate for deformation of these panels as a result of gravity effects caused by tilting the antenna to a desired elevation angle. For such applications, the next step in the operation, step 112, is to perform a far-field to holographic picture transformation. More particularly, usinq mathematical equations disclosed in an article entitled "*Microwave Holography Of Large Reflector Antennas--Simulation Algorithms*", by Y. Rahmat-Samii, I.E.E.E. Transactions On Antennas And Propagation, Vol. AP-33, No. 11, Nov. 1985, it is possible by performing an inverse Fourier transform on the determined far-field amplitude and phase values to obtain a picture of surface irregularities, referred to as a holographic picture, of the antenna dish or reflector. Separate pictures may be obtained for deviations in the positive or forward direction and for deviations in the negative or rearward direction. FIG. 7 is an illustration of one such picture obtained, in this case for negative deviations, by performing the transformation of step 112. In this drawing, the white regions are areas where there is substantially no deviation with deviations being greater with increasing darkness of the image. Thus, the regions marked 114 are, for example, regions of maximum deviation.

From drawings or pictures such as those shown in FIG. 7, a determination can be made as to which of the panels 13 need to be adjusted to eliminate the deviations and as to the degree of adjustment required for such panels. During step 116 the calculated adjustments may be made. These adjustments are made in standard fashion and are typically accomplished manually by loosening screws securing the panels, making small movements of the panels and then retightening the screws.

Once step 116 has been completed, it may be desirable to return to step 108 to retest the antenna by performing near-field measurements thereon. These readings would then be transformed durinq step 110 to far-field values and step 112 would be repeated on these values to obtain holographic deviation pictures of the antenna dish. If these pictures still show unacceptable deviations in antenna panel alignment, further adjustments could be made durinq step 116 and the process repeated until satisfactory antenna panel alignment has been achieved.

Since the process of performing near-field measurements might take several days, it may be necessary at various times during this process to stop the measurement operation and to recalibrate the various components of the system. In particular, it may be necessary to replace probe 50 with an interferometer, to again check the circularity of track 40 end to make further adjustments, either electronically or for example usinq screws 42, to this circularity as required. It may also be necessary to recalibrate the probe and to perform other alignment or calibrations at reasonable intervals during the measuring process.

A system is thus provided which permits near-field measurements to be made, and in particular which permits such measurements to be made on large antenna which are tilted to a desired elevation angle. These measurements may then be used to obtain far-field measurements and the far-field measurements may be utilized to generate holographic pictures of the antenna dish illustrating deviations therein which pictures may be utilized to guide realignment of dish panels.

While the invention has been particularly shown and described above with respect to a preferred embodiment, the foregoing and other changes in form and detail may be made therein without departing from the spirit and scope of the invention.

What is claimed is:

1. Apparatus for performing near-field measurements on an antenna which is biasable about a pivot point to a desired elevation comprising:
   pedestal means for mounting said antenna, said antenna being tiltable on said pedestal means about said pivot point to the desired elevation;
   a substantially circular track centered at and spaced a predetermined distance from said pivot point, said track extending for an arc which is greater than 180° by a number of degrees which is approximately equal to the range of elevation angles through which the antenna is biased;
   means for rotating said antenna azimuthally;
   a scanning probe;
   means for mounting said probe for controlled traversal of said track; and
   means for utilizing said probe to perform near-field measurements on said antenna at selected azimuthal positions of said antenna and selected positions of said probe on the track.

2. Apparatus as claimed in claim 1 wherein said track is mounted to a free-standing support arch which is supported at least by legs at each end thereof.

3. Apparatus as claimed in claim 2 wherein said arch is sufficiently stiff to damp vibrations caused by probe movement.

4. Apparatus as claimed in claim 2 including means for adjustably mounting said track to said arch in a manner such that the track is adjustable to be substantially circular regardless of circular irregularities in said arch.

5. Apparatus as claimed in claim 4 including means mountable to the probe mounting means in place of the probe for measuring circular irregularities in said track.

6. Apparatus as claimed in claim 2 including means for electronically compensating for small systematic deviations in circularity of said track.

7. Apparatus as claimed in claim 1 wherein the probe mounting means includes means for removably mounting said probe so that the probe mounted in said probe mounting means is replaceable.

8. Apparatus as claimed in claim 1 wherein the probe mounting means includes means for adjusting the positions of said probe.

9. Apparatus as claimed in claim 1 wherein the probe mounting means includes means for moving said probe along said track, means for indicating the position of said probe on said track and means for holding the probe in a desired position.

10. Apparatus as claimed in claim 1 wherein said rotating means includes means for rotating said pedestal means in predetermined steps through a 360° rotation.

11. Apparatus as claimed in claim 1 including means for obtaining at least two different polarizations for said probe.

12. Apparatus as claimed in claim 11 wherein said antenna has an antenna dish, and wherein said polarization obtaining means, said antenna rotating means and the proble mounting means operate in a predetermined sequence to effect measurement of the entire antenna dish.

13. Apparatus as claimed in claim 12 wherein measurements are taken at selected angular separations for said antenna rotating means and said probe mounting means, which separations satisfy Nyquest's sampling theorem.

14. A method for realigning panels of a dish antenna to compensate for gravity effects when the antenna is biased about a pivot point to a selected elevation angle comprising the steps of:
(a) mounting the antenna on a test pedestal in a test chamber having a substantially circular track mounted therein, the track having a test probe mounted for controlled travel therealong;
(b) aligning at least one of said test pedestal and track so that said track is centered at said pivot point;
(c) moving said antenna and probe through a predetermined sequence of sample test points, said moving step comprising the steps of steppinq the test pedestal through a 360° azimuthal rotation while steppinq said probe along said track, said two steppinq steps being performed in a predetermined sequence;
(d) utilizing an RF signal transmitted by said antenna or said probe and received by the other to perform near-field measurements at each sample test point;
(e) performing a near-field to far-field transformation on said near-field measurements;
(f) performing a far-field to holographic picture transformation on the transformed far-field values to obtain indications of dish panel misalignment; and
(g) utilizing said indications to realign appropriate panels.

15. A method as claimed in claim 14 including the step of:
(h) repeating at least steps (c) through (h) until, durinq step (f), the indications of dish panel misalignment are within acceptable limits.

16. A method as claimed in claim 14 wherein said moving step includes the step of obtaining at least two different polarizations from said probe.

17. A method a claimed in claim 14 wherein the angular separation for the sample test points satisfy Nyquest s sampling theorem.

* * * * *